United States Patent
Bashir et al.

(10) Patent No.: US 7,412,346 B2
(45) Date of Patent: Aug. 12, 2008

(54) REAL-TIME TEMPERTURE DETECTION DURING TEST

(75) Inventors: Mo S. Bashir, Beaverton, OR (US); Arun Krishnamoorthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/553,616

(22) Filed: Oct. 27, 2006

(65) Prior Publication Data

US 2008/0103724 A1    May 1, 2008

(51) Int. Cl.
G01K 17/00 (2006.01)
G06F 15/00 (2006.01)

(52) U.S. Cl. .............. 702/130; 702/132; 702/185; 702/188; 713/300; 324/600; 714/741

(58) Field of Classification Search ........ 702/130, 702/132, 57, 58, 59, 60, 61, 104, 116, 131, 702/133, 136, 182, 183, 185, 188, 189, 93; 713/300, 332
See application file for complete search history.

(56) References Cited

U.S. PATENT DOCUMENTS

| | | | |
|---|---|---|---|
| 5,617,531 A * | 4/1997 | Crouch et al. ............... 714/30 |
| 5,838,578 A | 11/1998 | Pippin | |
| 6,006,169 A | 12/1999 | Sandhu et al. | |
| 6,975,047 B2 | 12/2005 | Pippin | |
| 6,980,918 B2 | 12/2005 | Gunther et al. | |
| 7,006,943 B1 * | 2/2006 | Mitchell et al. ............ 702/132 |
| 7,272,763 B2 * | 9/2007 | Gearhardt et al. .......... 714/733 |
| 2004/0071183 A1 | 4/2004 | Tesi et al. | |
| 2006/0161375 A1 * | 7/2006 | Duberstein et al. ......... 702/132 |

* cited by examiner

*Primary Examiner*—Hal Wachsman
*Assistant Examiner*—Phuong Huynh
(74) *Attorney, Agent, or Firm*—Schwabe, Williamson & Wyatt, P.C.

(57) ABSTRACT

Apparatuses, methods, and systems associated with and/or having components capable of, detecting a temperature of an integrated circuit in real time during testing are disclosed herein. In exemplary embodiments, an integrated circuit includes a register to store a temperature limit for the integrated circuit; a temperature sensor formed on the integrated circuit to sense a temperature of the integrated circuit, and output a signal indicative of the temperature sensed, based at least in part on the temperature sensed; and testing logic coupled to the register and the temperature sensor to record a temperature violation if at any time during a testing mode of operation the temperature sensed by the temperature sensor violates the stored temperature limit.

20 Claims, 3 Drawing Sheets

REAL-TIME TEMPERTURE DETECTION DURING TEST

TECHNICAL FIELD

Embodiments of the invention relate generally to the field of testing of electronic devices, specifically to methods, apparatuses, and systems associated with thermal detection of integrated circuits during testing.

BACKGROUND

During the manufacturing of electronic devices, individual integrated circuits generally undergo testing for functional and other defects using automated test equipment. The tests sometimes are performed at various temperatures; for example, "hot" and "cold" testing. During such tests, it may be important to keep the junction temperature of the integrated circuit being tested ("Device Under Test"—DUT) substantially close to the selected temperature set points.

To maintain the temperature of the DUT at selected temperature set points, an automatic thermal control equipment handler (ATC) may be used. In general, the ATC attempts to maintain a constant temperature set point before test (sometimes called "T-soak") as well as actively cool the DUT during execution of the test pattern(s). The degree of cooling is modulated during the test as a function of the DUT temperature and the electrical power consumed by the DUT. Owing to the fact that this thermal control has a dynamic behavior, the temperature of the DUT is difficult to control. Specifically, the temperature of the DUT may undershoot (e.g., due to overcooling) or overshoot (e.g., due to less cooling) the desired set point. As a result, the DUT may be undertested giving rise to potential quality issues, or may be overtested affecting yield, reliability, and/or other issues.

A thermal diode disposed at the edges of the DUT is sometimes used to determine whether temperature overshoot or undershoot of the DUT occurred during a test. The diode is read only after the conclusion of a test and the reading is then compared to predetermined guardbands (e.g., minimum and/or maximum temperature limits). Due to the location of the diode, the estimation of the temperature generally can never be close to the true temperature at the core of the DUT. In addition, the diode is measured at the end of a test rather than during execution of the test, at which point the temperature of the DUT may have changed. Furthermore, analyzing such data after the test is completed adds a significant amount of additional processing time, which may be incompatible with high-volume manufacturing needs. As a result of these problems, the cooling of the DUT is usually very conservative and the guardband(s) are usually sizeable to ensure that passing DUT meet the desired standards.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)." The phrase "(A) B" means "(B) or (A B)," that is, A is optional.

In embodiments of the present invention, apparatuses, methods, and systems for integrated circuit testing are provided. In various embodiments, temperature(s) of one or more interior locations of an integrated circuit may be monitored in real time during a testing operation (e.g., electrical testing). In various embodiments, a sensed temperature of an integrated circuit may be compared to a pre-programmed temperature limit, and a violation of the pre-programmed temperature limit may be recorded at the time of the violation.

Figure 1:
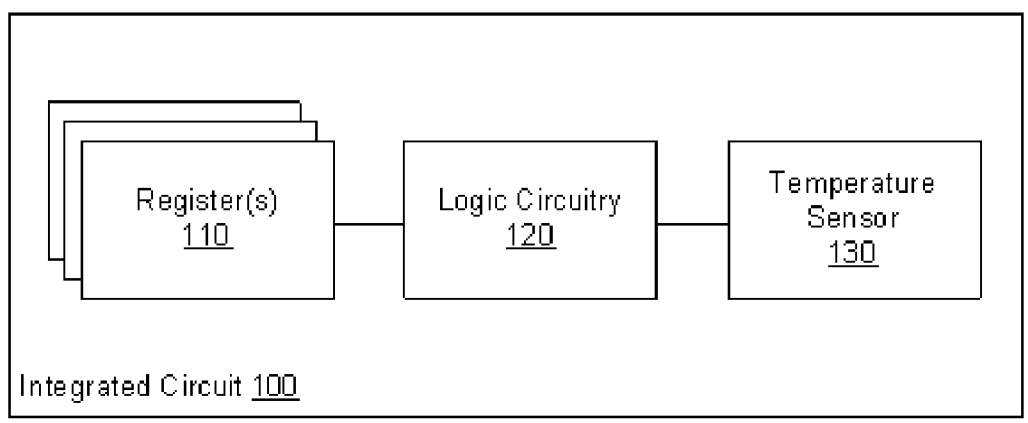
FIG. 1 illustrates an integrated circuit in accordance with various embodiments.

Referring now to FIG. 1, illustrated is an embodiment of an integrated circuit 100 according to various embodiments of the present invention. In various embodiments, integrated circuit 100 may comprise one or more features to enable integrated circuit 100 of monitoring a temperature of one or more locations of integrated circuit 100 in real time during a testing operation.

In various embodiments, integrated circuit 100 may comprise one or more registers 110. In embodiments, register 110 may be configured to store a temperature limit for integrated circuit 100. In various embodiments, a temperature limit may be any one or more limits including, for example, a minimum temperature limit and a maximum temperature limit. In various embodiments, a temperature limit may be any predetermined parameter based at least in part on a temperature of one or more locations of integrated circuit 100. A minimum temperature limit, maximum temperature limit, or some other temperature limit may be determined based at least in part on various factors, depending on the applications. For example, a temperature limit may be based at least part on a type of integrated circuit being tested (e.g., based on leakage power, speed, power consumed, etc.) and/or a type of test being executed (e.g., a functional test, a structural test, etc.).

In exemplary embodiments, integrated circuit 100 may comprise two registers 110. In various ones of these embodiments, a first register may store a first temperature limit and a second register to store a second temperature limit. For example, a first register may store an upper temperature limit and a second register may store a lower temperature limit. In various other embodiments, integrated circuit 100 may comprise more or less than two registers, depending on the applications.

A temperature of integrated circuit 100 may be sensed by one or more temperature sensors 130. In various embodiments, temperature sensor 130 may be located directly on integrated circuit 100 and may be adapted to sense a temperature of the interior location or proximal to the interior location. In various embodiments, temperature sensor 130 may be formed at a location of integrated circuit 100 known to exhibit temperature variations, increased temperatures, etc., to account for thermal gradients across integrated circuit 100. For example, it may be desirable to locate temperature sensor 130 at the core of integrated circuit 100. Still further, in various embodiments, integrated circuit 100 may comprise multiple temperature sensors 130, depending on the applications.

In various embodiments, temperature sensor 130 may be adapted to output a signal indicative of a temperature sensed. In various ones of these embodiments, a signal outputted may be based at least in part on the temperature sensed. For example, in various embodiments, temperature sensor 130 may be adapted to output a signal only if a failing temperature is sensed. In various other embodiments, however, temperature sensor 130 may be adapted to output a signal for any temperature sensed. In still other embodiments, temperature sensor 130 may be adapted to output different signals based at least in part on the temperature sensed; for example, a first signal indicative of a maximum temperature violation and a second signal indicative of a minimum temperature violation.

Temperature sensor 130 may be any type of temperature sensor. For example, in various embodiments, temperature sensor 130 may be a digital thermal sensor. In some embodiments, it may be necessary or desirable to calibrate temperature sensor 130. In an exemplary embodiment, temperature sensor 130 may be calibrated at one or more temperatures at which a testing operation is performed and/or at another temperature (e.g., room temperature, sort temperature, etc). In embodiments, integrated circuit 100 may include one or more calibration values and the calibration values may be used in calculating a temperature sensed by temperature sensor 130.

Integrated circuit 100 may comprise various logic circuitry. In various embodiments, integrated circuit 100 may comprise testing logic 120 and testing logic 120 may be coupled to register 110 and temperature sensor 130. Testing logic 120 may be adapted to record one or more temperature violations. For example, testing logic 120 may be adapted to record a temperature violation if at any time during a testing mode of operation the temperature of integrated circuit 100 violates a temperature limit.

In various embodiments, integrated circuit 100 may comprise a result bit. In embodiments, testing logic 120 may adapted to set the result bit to record a temperature violation. For example, in an embodiment, testing logic 120 may be adapted to record a temperature violation during a testing mode of operation.

In various embodiments, integrated circuit 100 may comprise one or more output pins. In various embodiments, an output pin may be coupled to a result bit to facilitate reading of the result bit after a test mode of operation. For example, an output pin may be coupled to a result bit to facilitate reading of the result bit after the test mode of operation to determine whether the result bit was set by testing logic 120 during the test mode of operation.

Integrated circuit 100 may be variously configured, depending on the applications. For example, in various embodiments, integrated circuit 100 may comprise one or more processor cores. In various ones of these embodiments, integrated circuit 100 may be configured such that one or more registers 110, temperature sensor 130, and testing logic 120 are all disposed in a processor core. In embodiments wherein integrated circuit 100 comprises more than one processor core, one or more of other processor core(s) may be similarly configured to include one or more other registers, another temperature sensor, and other testing logic.

Figure 2:
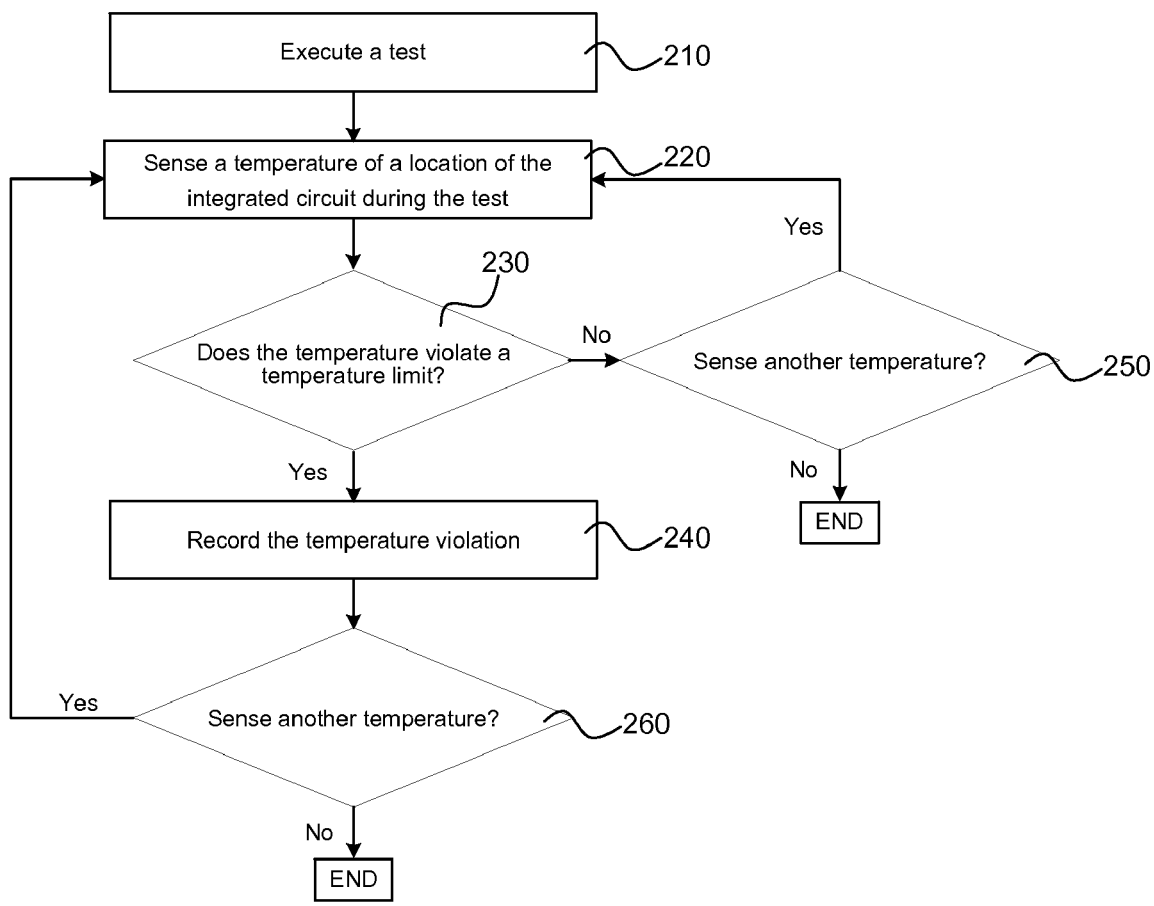
FIG. 2 illustrates a method of testing an integrated circuit in accordance with various embodiments.

Turning now to FIG. 2, shown is an exemplary embodiment of a method 200 of testing an integrated circuit. In various embodiments and as shown at 210, method 200 may comprise executing a test. A test may be any one of various tests usually performed to characterize an integrated circuit. For example, a test may be performed to determine reliability, functionality, and/or quality of an integrated circuit. A test may be performed at one of more various temperatures depending on the type of test executed. A test may comprise one or more electrical stimuli, in the form of one or more test patterns (sometimes referred to in the art as a test suite).

In various embodiments, a temperature of an interior location of an integrated circuit may be sensed during a test, as shown at 220. In various embodiments, if the temperature of the interior location of the integrated circuit violates a temperature limit, the violation may be recorded as shown at 230, 240. In various embodiments, another temperature reading may be sensed, as shown at 260, depending on the applications. If various embodiments, if no violation of a temperature limit occurs, one or more additional temperature readings may be sensed, or the testing method may end, as shown at 250, depending on the applications.

In various embodiments, a method for testing an integrated circuit may comprise adjusting a temperature of an integrated circuit based at least in part on a temperature violation. For example, in various embodiments, if an upper bound (maximum) temperature limit violation occurs, a temperature of an integrated circuit may be adjusted to reduce the temperature of the integrated circuit. For example, cooling of the integrated circuit may work to cool its temperature. Similarly, in various embodiments, if a lower bound (maximum) temperature limit violation occurs, a temperature of an integrated circuit may be adjusted to increase the temperature of the integrated circuit.

Figure 3:
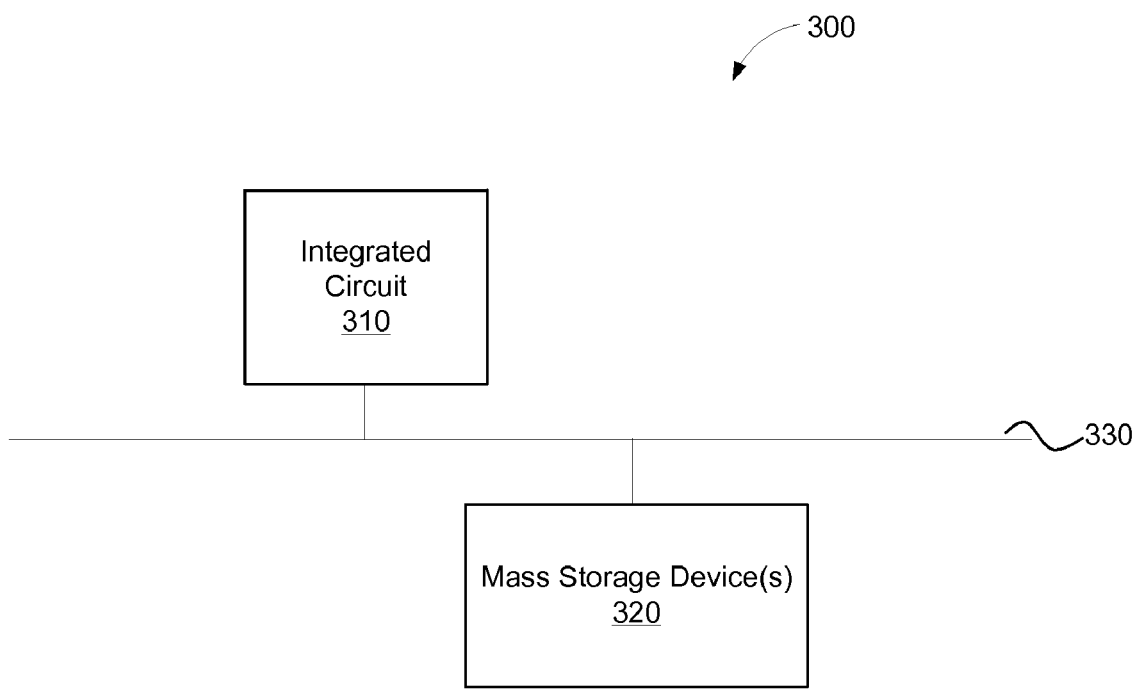
FIG. 3 illustrates a system incorporated with the teachings of the present invention, according to various embodiments.

In exemplary embodiments of the present invention, systems may be employed to perform one or more methods as disclosed herein. An exemplary system is illustrated in FIG. 3. As shown, a system 300 may comprise one or more integrated circuits 310 and one or more mass storage devices 320 coupled to integrated circuit 310 via bus 330. In various embodiments, integrated circuit 310 may be adapted to sense a temperature of an interior location of integrated circuit 310 during a testing mode of operation, and record a temperature violation if the sensed temperature violates a temperature limit.

In various embodiments, integrated circuit 310 may comprise one or more registers, a temperature sensor, and testing logic. In various embodiments, a register may be adapted to store a temperature limit for the integrated circuit 310. A temperature sensor may formed on a location of the integrated circuit 310 to sense a temperature of a proximal neighborhood of the location, and output a signal indicative of a temperature sensed, based at least in part on the temperature sensed. Testing logic may be coupled to a register and a temperature sensor to record a temperature violation if at any time during a testing mode of operation, the temperature sensed by the temperature sensor violates the stored temperature limit.

In various embodiments, mass storage device(s) 320 may take a variety of forms including, but are not limited to, a hard disk drive, a compact disc (CD) drive, a digital versatile disk (DVD) drive, a floppy diskette, a tape system, and so forth. In particular, mass storage device(s) 320 include programming instructions implementing all or selected aspects of the earlier-described embodiments of methods of the invention. In embodiments, system 300 may comprise a user interface to cause a test to be executed and/or display a temperature violation. In various embodiments, system 300 may be an automatic thermal control equipment handler or other system adapted to implement all or selected aspects of the earlier-described embodiments of methods of the invention.

In various embodiments, system 300 may be a fully integrated unit or may comprise a number of separate components that may be coupled or otherwise associated with each other. Furthermore, in embodiments endowed with a user interface, the user interface may comprise any one or more various software programs to aid in one or more of data acquisition, data storage, operation and/or control, and/or other various functions.

In various embodiments, system 300 may be a server, a wireless adapter, a wireless mobile phone, a set-top box, a personal digital assistant, a tablet computing device, a laptop computing device, a desktop computing device, and an entertainment control unit.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An integrated circuit comprising:
   a register to store a temperature limit for the integrated circuit;
   a temperature sensor formed on the integrated circuit to sense a temperature of the integrated circuit, and output a signal indicative of the temperature sensed, based at least in part on the temperature sensed;
   testing logic coupled to the register and the temperature sensor to record a temperature violation if at any time during a testing mode of operation the temperature sensed by the temperature sensor violates the stored temperature limit;
   a result bit, wherein the testing logic sets the result bit to record the temperature violation; and
   an output pin coupled to the result bit to facilitate reading of the result bit after the test mode of operation, to determine whether the result bit was set by the testing logic during the testing mode of operation.

2. The integrated circuit of claim 1, wherein the register stores a minimum temperature limit, and the testing logic records the temperature violation if at any time during a testing mode of operation the temperature sensed by the temperature sensor is below the stored minimum temperature limit.

3. The integrated circuit of claim 1, wherein the register stores a maximum temperature limit, and the testing logic records a temperature violation if at any time during a testing mode of operation the temperature sensed by the temperature sensor is above the stored maximum temperature limit.

4. The integrated circuit of claim 1, wherein the integrated circuit further comprises a result bit, and the testing logic sets the result bit to record the temperature violation.

5. The integrated circuit of claim 1, further comprising another register to cooperate with the register to store a lower and an upper temperature limit of a temperature range, and the testing logic records a lower bound violation if at any time during the test mode of operation the temperature sensed is below the stored lower temperature limit, and records an upper bound violation if at any time during the testing mode of operation the temperature sensed is above the stored upper temperature limit.

6. The integrated circuit of claim 5, further comprising a processor core, and the register, the temperature sensor, and the testing logic are all disposed in the processor core.

7. The integrated circuit of claim 6, further comprising another processor core similarly constituted as said processor core at least in having a similar register, temperature sensor, and testing logic arrangement.

8. The integrated circuit of claim 1, wherein the test temperature limit is based at least in part on a selected one or more of a test type and a device characteristic of the integrated circuit.

9. A method for testing an integrated circuit comprising:
   providing an electrical test stimulus to the integrated circuit;
   sensing a temperature of an interior location of the integrated circuit during said providing of the electrical test stimulus; and
   setting a result bit to record a temperature violation if the sensed temperature violates a temperature limit; and
   reading an output pin coupled to the result bit to determine whether the result bit was set during said providing the electrical test stimulus.

10. The method of claim 9, further comprising storing a minimum temperature limit, and recording the temperature violation if at any time during a testing mode of operation the temperature sensed is below the stored minimum temperature limit.

11. The method of claim 9, further comprising storing a maximum temperature limit, and recording the temperature violation if at any time during a testing mode of operation the temperature sensed is above the stored maximum temperature limit.

12. The method of claim 9, further comprising storing a lower and an upper temperature limit of a temperature range, and recording a lower bound violation if at any time during a test mode of operation the temperature sensed is below the stored lower temperature limit, and recording an upper bound violation if at any time during the test mode of operation the temperature sensed is above the stored upper temperature limit.

13. The method of claim 9, further comprising adjusting the temperature of the integrated circuit based at least in part on the temperature violation.

14. A system comprising:
   an integrated circuit including:
      a register to store a temperature limit for the integrated circuit;
      a temperature sensor formed on the integrated circuit to sense a temperature of the integrated circuit, and output a signal indicative of the temperature sensed, based at least in part on the temperature sensed;

testing logic coupled to the register and temperature sensor to record a temperature violation if at any time during a testing mode of operation the temperature sensed by the temperature sensor violates the stored temperature limit;

a result bit, wherein the testing logic sets the result bit to record the temperature violation; and an output pin coupled to the result bit to facilitate reading of the result bit after the test mode of operation, to determine whether the result bit was set by the testing logic during the test mode of operation; and one or more mass storage devices coupled to the integrated circuit.

15. The system of claim 14, wherein the register stores a minimum temperature limit, and the testing logic records the temperature violation if at any time during a testing mode of operation the temperature sensed by the temperature sensor is below the stored minimum temperature limit.

16. The system of claim 14, wherein the register stores a maximum temperature limit, and the testing logic records a temperature violation if at any time during a testing mode of operation, the temperature sensed by the temperature sensor is above the stored maximum temperature limit.

17. The system of claim 14, further comprising another register to cooperate with the register to store a lower and an upper temperature limit of a temperature range, and the testing logic records a lower bound violation if at any time during the test mode of operation the temperature sensed is below the stored lower temperature limit, and records an upper bound violation if at any time during the test mode of operation the temperature sensed is above the stored upper temperature limit.

18. The system of claim 17, further comprising a processor core, and the register, the temperature sensor, and the testing logic are all disposed in the processor core.

19. The system of claim 18, further comprising another processor core similarly constituted as said processor core at least in having a similar register, temperature sensor, and testing logic arrangement.

20. The system of claim 14, wherein the system comprises a selected one of a server, a wireless adapter, a wireless mobile phone, a set-top box, a personal digital assistant, a tablet computing device, a laptop computing device, a desktop computing device, and an entertainment control unit.

* * * * *

UNITED STATES PATENT AND TRADEMARK OFFICE
CERTIFICATE OF CORRECTION

PATENT NO. : 7,412,346 B2
APPLICATION NO. : 11/553616
DATED : August 12, 2008
INVENTOR(S) : Bashir et al.

It is certified that error appears in the above-identified patent and that said Letters Patent is hereby corrected as shown below:

On the Title Page Item (54)
Title, "REAL-TIME TEMPERTURE..." should read --REAL-TIME TEMPERATURE...--.

Column 7
Lines 3-4, "...and temperature sensor..." should read --...and the temperature sensor...--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO.        : 7,412,346 B2
APPLICATION NO.   : 11/553616
DATED             : August 12, 2008
INVENTOR(S)       : Bashir et al.

It is certified that error appears in the above-identified patent and that said Letters Patent is hereby corrected as shown below:

On the Title Page Item (54) and Column 1, line 1,
Title, "REAL-TIME TEMPERTURE..." should read --REAL-TIME TEMPERATURE...--.

Column 7
Lines 3-4, "...and temperature sensor..." should read --...and the temperature sensor...--.

This certificate supersedes the Certificate of Correction issued November 10, 2009.

Signed and Sealed this

First Day of December, 2009

David J. Kappos
*Director of the United States Patent and Trademark Office*